United States Patent
Lien et al.

(10) Patent No.: US 8,846,428 B2
(45) Date of Patent: Sep. 30, 2014

(54) METHOD FOR MANUFACTURING LIGHT EMITTING DIODE CHIP WITH ELECTRODES HAVING SMOOTH SURFACES

(71) Applicant: Advanced Optoelectronic Technology, Inc., Hsinchu Hsien (TW)

(72) Inventors: Ya-Chi Lien, Hsinchu (TW); Tzu-Chien Hung, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/942,713

(22) Filed: Jul. 16, 2013

(65) Prior Publication Data

US 2014/0099739 A1  Apr. 10, 2014

(30) Foreign Application Priority Data

Oct. 10, 2012 (CN) .......................... 2012 1 03817443

(51) Int. Cl.
*H01L 33/06* (2010.01)
*H01L 33/18* (2010.01)
*H01L 33/36* (2010.01)

(52) U.S. Cl.
CPC ...................................... *H01L 33/36* (2013.01)
USPC ................................ 438/39; 438/55; 438/116

(58) Field of Classification Search
CPC .......... H01L 33/22; H01L 33/44; H01L 33/58
See application file for complete search history.

(56) References Cited

U.S. PATENT DOCUMENTS

| 5,909,459 A * | 6/1999 | Ishibashi et al. ................. 372/96 |
| 2003/0207480 A1* | 11/2003 | Kobayashi et al. .............. 438/22 |
| 2010/0032701 A1* | 2/2010 | Fudeta ............................ 257/98 |

* cited by examiner

*Primary Examiner* — Zandra Smith
*Assistant Examiner* — Pamela E Perkins
(74) *Attorney, Agent, or Firm* — Novak Druce Connolly Bove + Quigg LLP

(57) ABSTRACT

A method for manufacturing a light emitting diode chip includes the following steps: providing an epitaxial structure having an epitaxial layer; forming a first electrode and a second electrode on the epitaxial layer; coating an inert layer on the epitaxial structure, the first electrode and the second electrode continuously; annealing the first electrode and the second electrode; and removing the inert layer coated on the first electrode and the second electrode to expose the first electrode and the second electrode.

14 Claims, 5 Drawing Sheets

METHOD FOR MANUFACTURING LIGHT EMITTING DIODE CHIP WITH ELECTRODES HAVING SMOOTH SURFACES

BACKGROUND

1. Technical Field

The disclosure relates to methods for manufacturing the light emitting diode chip, and particularly to a method for manufacturing the light emitting diode chip having electrodes with smooth surfaces.

2. Description of the Related Art

A conventional light emitting diode chip (LED) includes a substrate, a light emitting structure having an N-type semiconductor layer, an active layer and a P-type semiconductor layer formed on the substrate in sequence, and two electrodes (i.e., N-type and P-type electrodes) respectively connected to the N-type and P-type semiconductor layers. The two electrodes are always made of metal material and made by electroplating, evaporating or micro film deposition. Generally, an annealing process is provided after the electrodes are formed to reduce a fragility and residual stress of the metal electrodes and refine metal crystalline structures inside the metal electrodes to obtain a high quality of the electrodes.

However, metal particles inside the metal electrodes will diffuse to form rough surfaces of the electrodes when the electrodes are in a high temperature in the annealing process. Furthermore, since the ITO (indium tin oxide) layer on which the P-type electrode is formed has a rough surface in nature, the surface of the P-type electrode correspondingly is rough. A rough surface of the electrode will increase impedance between the electrodes and wires during a wire bonding process. Further, there are other disadvantages of the rough surfaces of the electrodes, such as the wires are difficult to be reliably attached on the rough surfaces of the electrodes, and a different color will be shown on the rough surfaces of the electrodes to confuse operators in a following testing process for the electrodes.

Therefore, it is desirable to provide a method for manufacturing a light emitting diode chip which can overcome the above shortcomings.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present light emitting diode chip and a method for manufacturing the light emitting diode chip. Moreover, in the drawings, like reference numerals designate corresponding parts throughout the views.

DETAILED DESCRIPTION

Figure 5:
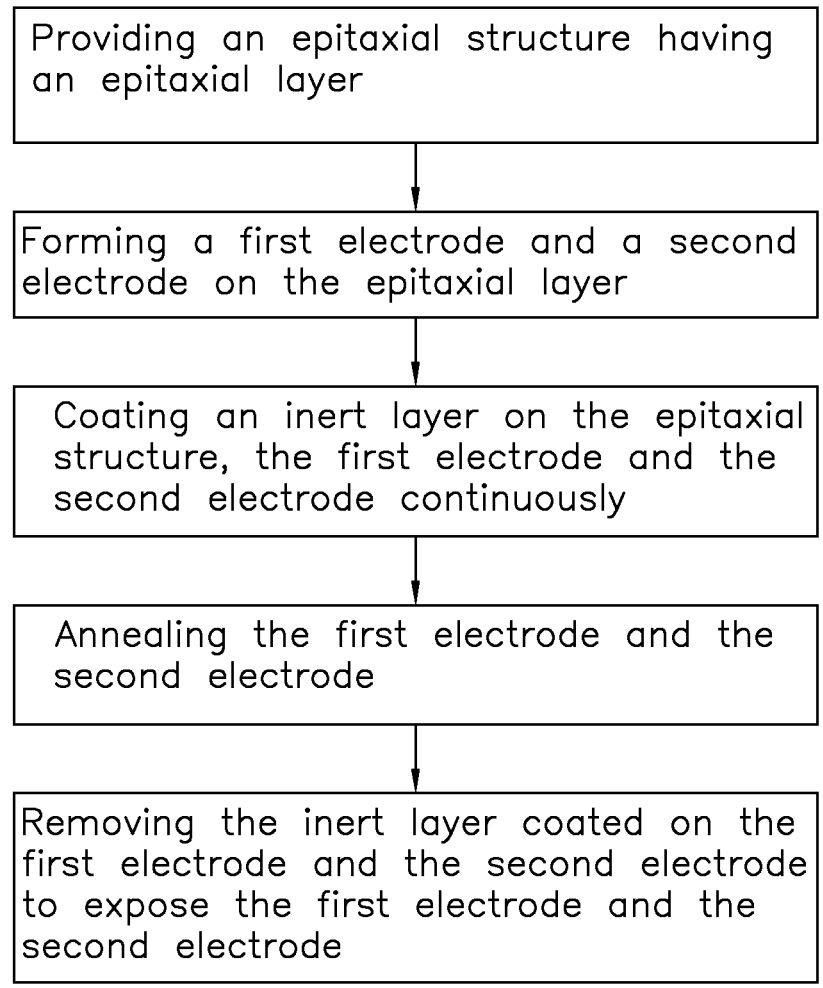
FIG. 5 is a flow chart of the method consisting of the steps of FIGS. 1-4.

FIG. 5 shows a flow chart of a method for manufacturing a light emitting diode chip. Also referring to FIGS. 1-4, the method for manufacturing the light emitting diode chip in accordance with the embodiment of the present disclosure includes steps of:

Step 1: providing an epitaxial structure 10 having a substrate 11 and an epitaxial layer 12 formed on the substrate 11;

Step 2: forming a first electrode 21 and a second electrode 22 on the epitaxial layer 12;

Step 3: coating an inert layer 30 on the epitaxial structure 10, the first electrode 21 and the second electrode 22 continuously;

Step 4: annealing the first electrode 21 and the second electrode 22; and

Step 5: removing the inert layer 30 coated on the first electrode 21 and the second electrode 22 to expose the first electrode 21 and the second electrode 22.

Figure 1:
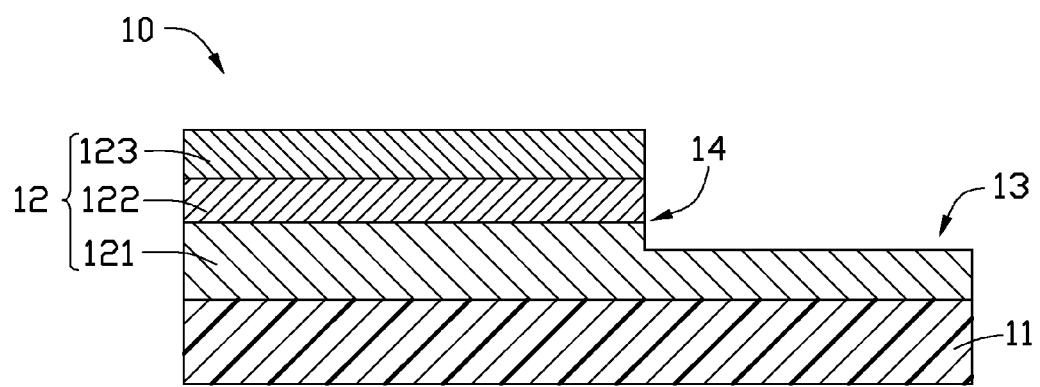
FIGS. 1-4 are schematic cross sections showing a light emitting diode chip processed by various steps of a method in accordance with an embodiment of the present disclosure.

In step 1, referring to FIG. 1, the substrate 11 can be sapphire ($\alpha$-$Al_2O_3$) substrate, silicon carbide (SiC) substrate, etc. In this embodiment, the substrate 11 is rectangular and thin. The epitaxial layer 12 includes a first-type semiconductor layer 121, an active layer 122, and a second-type semiconductor layer 123 formed on the substrate 11 in sequence from bottom to top. In other words, the first-type semiconductor layer 121 is formed on the substrate 11 directly. The active layer 122 is sandwiched between the first-type semiconductor layer 121 and the second-type semiconductor layer 123. The first-type semiconductor layer 121, the active layer 122 and the second-type semiconductor layer 123 can be made of III-V or II-VI compound semiconductors. The first-type semiconductor layer 121 and the second-type semiconductor layer 123 are doped with different materials. In this embodiment, the first-type semiconductor layer 121 is N-type doped, and the second-type semiconductor layer 123 is P-type doped. In alternative embodiment, the first-type semiconductor layer 121 can be P-type doped, and the second-type semiconductor layer 123 can be N-type doped.

The first-type semiconductor layer 121 includes a first region 13 exposed outside and a second region 14 covered by the active layer 122 away from the substrate 11. The active layer 122 and the second-type semiconductor layer 123 are formed on the second region 14. Alternatively, a buffer layer (not shown) made of GaN or AlN can be grown on the substrate 11 before the first-type semiconductor layer 121 is formed on the substrate 11 to improve the quality of growth of the first-type semiconductor layer 121 on the substrate 11.

The active layer 122 can be a single quantum well (SQW) structure or a multiple quantum well (MQW) structure.

Figure 2:
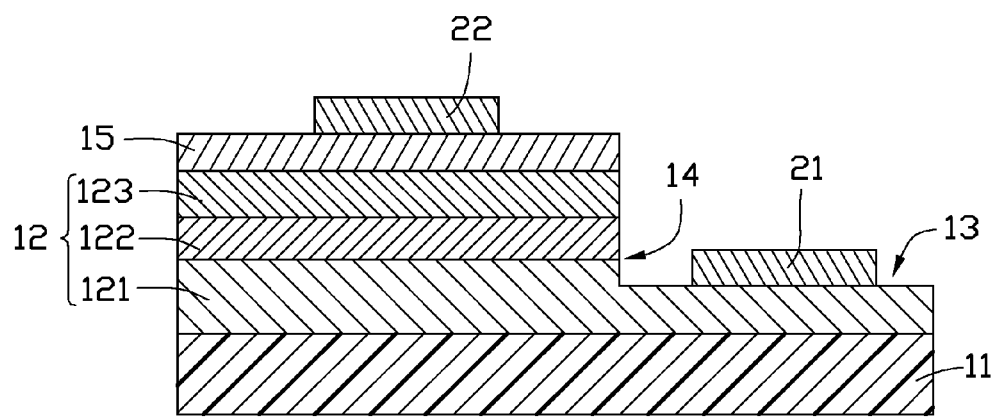

Referring to FIG. 2, a transparent conductive layer 15 which is made of an indium tin oxide (ITO) layer can be further formed on the second-type semiconductor layer 123 to achieve a homogenous current distribution between the second electrode 22 and the second-type semiconductor 123.

In step 2, the first electrode 21 and the second electrode 22 can be made by electroplating, evaporating or micro film deposition. In this embodiment, the first electrode 21 and the second electrode 22 are made of gold and made by evaporating. The first electrode 21 is formed on the first area 13 of the first-type semiconductor layer 121. The second electrode 22 is formed on the transparent conductive layer 15 on the second-type semiconductor 123. The first electrode 21 has a same polarity as the first-type semiconductor layer 121, and the second electrode 22 has a same polarity as the second-type semiconductor layer 123. In this embodiment, the first electrode 21 is an N-type electrode and the second electrode 22 is a P-type electrode. In an alternative embodiment, the light emitting diode chip 10 can be a vertical structure which has the first electrode 21 and the second electrode 22 located at a top and a bottom end thereof. Furthermore, the substrate 11 can be omitted.

Figure 3:
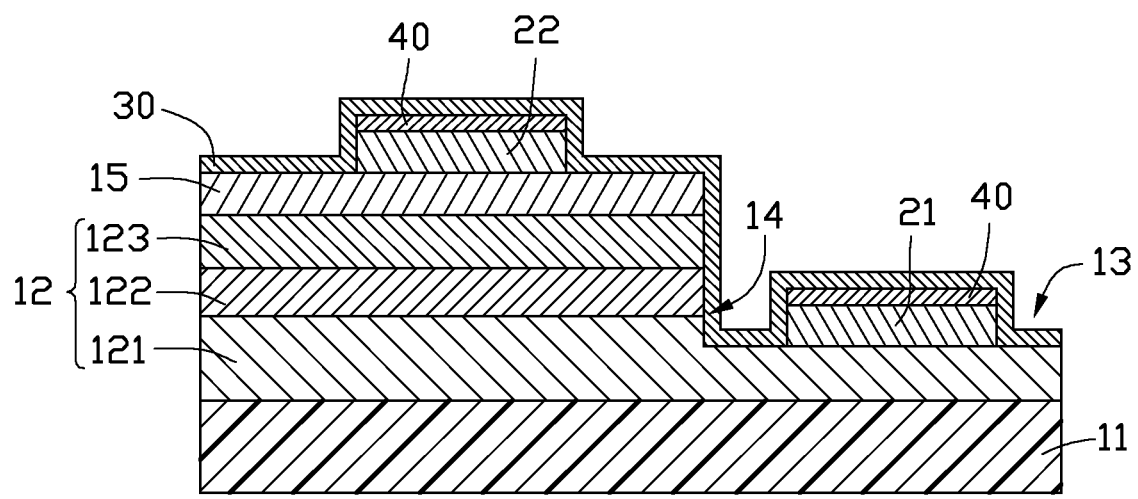
Figure 4:
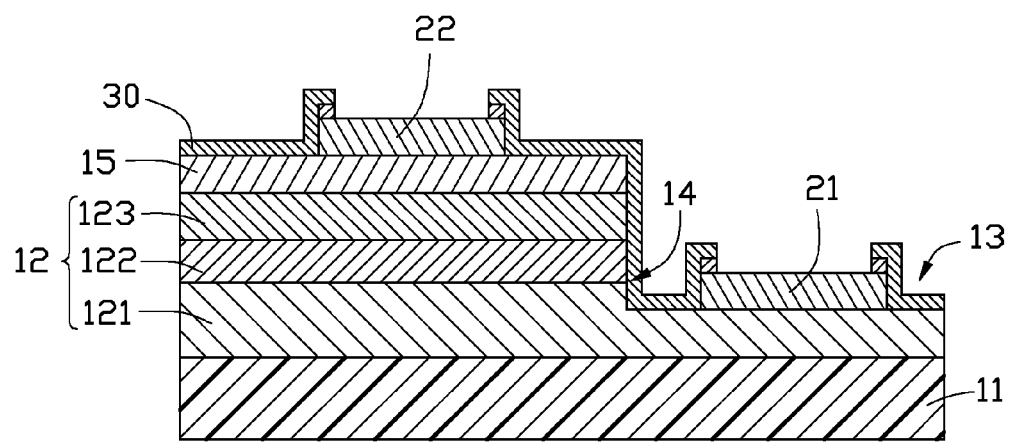

In step 3, referring to FIG. 3, the inert layer 30 is coated on the epitaxial structure 10, the first electrode 21 and the second electrode 22. The inert layer 30 can be made of silicon dioxide ($SiO_2$) or silicon nitride (SiN) and made by Metal Organic Chemical Vapor Deposition (MOCVD). The inert layer 30 covers exposed surfaces of the epitaxial structure 10, the first electrode 21 and the second electrode 22 to protect the epitaxial structure 10, the first electrode 21 and the second electrode 22 from degradation due to heat in a following annealing process. A thickness of the inert layer 30 is between 1000 angstroms and 5000 angstroms.

In step 4, the annealing process is operated in nitrogen environment. In the annealing process, the light emitting diode chip is heated to a pre-determined temperature for a pre-determined period of time, and then cooled down. Metal particles inside the first electrode 21 and the second electrode 22 will not diffuse in a high temperature because the surfaces of the first electrode 21 and the second electrode 22 are covered by the inert layer 30, which protects the surfaces of the first and second electrode 21, 22 to be smooth. Thus, the smooth surfaces of the first electrode 21 and the second electrode 22 can facilitate the next wire bonding process on the first electrode 21 and the second electrode 22, and easy check of the first electrode 21 and the second electrode 22 during a testing process.

In step 5, the inert layer 30 covering the first electrode 21 and the second electrode 22 is removed to expose the first electrode 21 and the second electrode 22 outside to obtain the light emitting diode chip. The inert layer 30 can be removed by etching or cutting. In this embodiment, the inert layer 30 covering a central surface of the first electrode 21 and the second electrode 22 is removed by dry etching.

Referring to FIG. 3 again, a step of forming a transition metal layer 40 can be further provided before the step of forming the inert layer 30. The transition metal layer 40 is made of a metallic material with a good bonding capability with the inert layer 30, such as titanium (Ti), nickel (Ni), tungsten (Wu), chromium (Cr), aluminum (Al), palladium (Pd) or alloy thereof. The bonding force between the transition metal layer 40 and the inert layer 30 is higher than that between the first and second electrode 21, 22 and the inert layer 30. A thickness of the transition metal layer 40 is between 50 angstroms and 500 angstroms. A cracking deformation between the first and second electrode 21, 22 and the inert layer 30 will be avoided in the annealing process caused by different expansions between different materials in a high temperature because the transition metal layer 40 has a good bonding with the inert layer 30.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for manufacturing a light emitting diode chip comprising steps:
   providing an epitaxial structure having an epitaxial layer;
   forming a first electrode and a second electrode on the epitaxial layer;
   coating an inert layer on the epitaxial structure, the first electrode and the second electrode continuously;
   annealing the first electrode and the second electrode; and
   removing the inert layer coated on the first electrode and the second electrode to expose the first electrode and the second electrode;
   wherein a step of forming a transition metal layer on each of the first and second electrodes is preformed before the step of coating an inert layer, whereby the inert layer is coated on the transition layers on the first and second electrodes.

2. The method for manufacturing a light emitting diode chip of claim 1, wherein the transition metal layer is made of a metallic material, a bonding force between the transition metal layer and the inert layer is higher than that between the first electrode, the second electrode and the inert layer.

3. The method for manufacturing a light emitting diode chip of claim 2, wherein a thickness of the transition metal layer is between 50 angstroms and 500 angstroms.

4. The method for manufacturing a light emitting diode chip of claim 1, wherein the first electrode and the second electrode are made of gold.

5. The method for manufacturing a light emitting diode chip of claim 4, wherein the transition metal layer is made of titanium, nickel, tungsten, chromium, aluminum, palladium or alloy thereof.

6. The method for manufacturing a light emitting diode chip of claim 1, wherein the inert layer is made of silicon dioxide or silicon nitride.

7. The method for manufacturing a light emitting diode chip of claim 1, wherein a thickness of the inert layer is between 1000 angstroms and 5000 angstroms.

8. The method for manufacturing a light emitting diode chip of claim 1, wherein the epitaxial layer comprises a first-type semiconductor layer, an active layer, and a second-type semiconductor layer, and the active layer is sandwiched between the first-type semiconductor layer and the second-type semiconductor layer.

9. The method for manufacturing a light emitting diode chip of claim 8, wherein the first-type semiconductor layer comprises a first region and a second region, the first region is exposed outside, the second region is covered by the active layer, the first electrode is formed on the first region of the first-type semiconductor layer, and the second electrode is formed on the second-type semiconductor layer.

10. The method for manufacturing a light emitting diode chip of claim 9, wherein a transparent conductive layer is further formed on the second-type semiconductor layer, and the second electrode is formed directly on the transparent conductive layer.

11. The method for manufacturing a light emitting diode chip of claim 8, wherein the epitaxial structure further comprises a substrate, the first-type semiconductor layer, the active layer, and a second-type semiconductor layer are formed on the substrate in sequence from bottom to top.

12. The method for manufacturing a light emitting diode chip of claim 11, wherein the first-type semiconductor layer is N-type doped, and the second-type semiconductor layer is P-type doped.

13. The method for manufacturing a light emitting diode chip of claim 1, wherein the first electrode and the second electrode are made by evaporating.

14. The method for manufacturing a light emitting diode chip of claim 1, wherein the inert layer is removed by dry etching.

* * * * *